(12) United States Patent
Erturk et al.

(10) Patent No.: US 7,327,572 B2
(45) Date of Patent: Feb. 5, 2008

(54) HEAT DISSIPATING DEVICE WITH ENHANCED BOILING/CONDENSATION STRUCTURE

(75) Inventors: Hakan Erturk, Phoenix, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/582,626

(22) Filed: Oct. 17, 2006

(65) Prior Publication Data

US 2007/0035927 A1 Feb. 15, 2007

Related U.S. Application Data

(62) Division of application No. 10/870,201, filed on Jun. 16, 2004.

(51) Int. Cl.
*H05K 7/20* (2006.01)
*F28D 15/00* (2006.01)
*H01L 23/34* (2006.01)

(52) U.S. Cl. ................ 361/700; 361/699; 165/104.33; 257/715

(58) Field of Classification Search ............... 360/700; 361/697, 700, 699; 165/104.33; 257/715
See application file for complete search history.

(56) References Cited

U.S. PATENT DOCUMENTS 3,598,180 A 8/1971 Moore, Jr.
3,952,797 A 4/1976 Voboril et al.
4,313,492 A 2/1982 Andros et al.
4,995,451 A * 2/1991 Hamburgen ............ 165/140.33
5,412,535 A * 5/1995 Chao et al. ................. 361/700
6,301,107 B1 * 10/2001 Lev et al. ................... 361/687
6,388,882 B1 5/2002 Hoover et al.
7,246,655 B2 * 7/2007 Mochizuki et al. .... 165/104.26
2003/0051859 A1 3/2003 Chesser et al.
2004/0093887 A1 5/2004 Shyy et al.
2005/0016828 A1 * 1/2005 Bednarek et al. ............... 203/1

FOREIGN PATENT DOCUMENTS

WO PCT/US2005/017873 10/2005

OTHER PUBLICATIONS

Liter, S.G., et al., "Pool-boiling CHF enhancement by modulated porous-layer coating: theory and experiment," International Journal of Heat and Mass Transfer 44, 2001, pp. 4287-4311.

* cited by examiner

*Primary Examiner*—Jayprakash Gandhi
*Assistant Examiner*—Zachary M Pape
(74) *Attorney, Agent, or Firm*—Blakely, Sokoloff, Taylor & Zafman LLP

(57) ABSTRACT

A heat dissipating device. The heat dissipating device comprises a receptor plate to be placed over a device that generates heat, an evaporator coupling to the receptor plate, a condenser column placed in fluid communication with the evaporator, and a set of condenser extension surfaces extending from the condenser. The evaporator includes a modulated porous layer and stores liquid. The condenser column includes a non-wetting surface. The condenser extension surface facilitates heat dissipation.

8 Claims, 4 Drawing Sheets

Capillary pumping

Heat

Dropwise condensation rather than filmwise
124

HEAT DISSIPATING DEVICE WITH ENHANCED BOILING/CONDENSATION STRUCTURE

RELATED APPLICATIONS

This application is a divisional application of U.S. application Ser. No. 10/870,201, filed on Jun. 16, 2004, currently pending.

BACKGROUND

Embodiments of the present invention relate to an apparatus for dissipating heat and method dissipating heat. Particularly, the embodiments of the invention relate an enhanced thermosiphon device having low thermal resistance because of using novel boiling/condensation structures.

Integrated circuits are used in many devices and their performances are critical to the electronic industry. Integrated circuits are advancing toward miniaturization for more efficient systems. As the integrated circuits get smaller and smaller, the integrated circuit speed, capacity, and performance increases. At the same time, the energy produced by the integrated circuits also increases and more heat is thus generated. The current trend has been to develop apparatuses and methods to dissipate the heat generated by the integrated circuits and cool the integrated circuits to prevent damages and performance failure.

One way to cool integrated circuits is referred to as heat exchange. A conventional heat exchange device used to cool an integrated circuit includes a solid base plate placed on top of the integrated circuit. The base plate is coupled to a set of extended surfaces to increase surface areas for heat to dissipate. Heat generated by the integrated circuit is transferred to the base plate. Heat is then transferred to the extended surfaces. And, air is typically blown through the extended surfaces to dissipate heat.

Additionally, there are two other ways to cool the circuit elements, which employ the principles of a thermosiphon and a heat pipe. In the thermosiphon, a container is provided with liquid coolant in an evaporator section and heat input to this section results in vapor, which condenses in a condenser section where heat is rejected. The thermosiphon relies on external forces, such as gravity, to return the condensate vertically along the sidewalls to the evaporator section. As a result, the thermosiphon is a unidirectional heat transfer device (a thermal diode) limited by orientation.

In the heat pipe, a container is provided with a liquid coolant in an evaporator section and heat input to this section results in the formation of vapor, which condenses in a condenser section where heat is rejected. The heat pipe uses the capillary forces of an internal wick structure to recirculate condensate to the evaporator section.

It is desirable to improve the efficiency of the apparatuses and methods that use heating, condensation and evaporation to cool the integrated circuits.

BRIEF DESCRIPTION OF THE DRAWINGS

The embodiments of the present invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" or "one" embodiment of the invention in this disclosure are not necessarily to the same embodiment, and they mean at least one. In the drawings.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Exemplary embodiments of the present invention pertain to an apparatus for dissipating heat and method for dissipating heat. Particularly, the embodiments of the invention relate to an enhanced thermosiphon device having low thermal resistance for use in boiling/condensation structures. In addition, the exemplary embodiments also pertain to apparatuses and methods of cooling high power electronic circuits.

Figure 1:
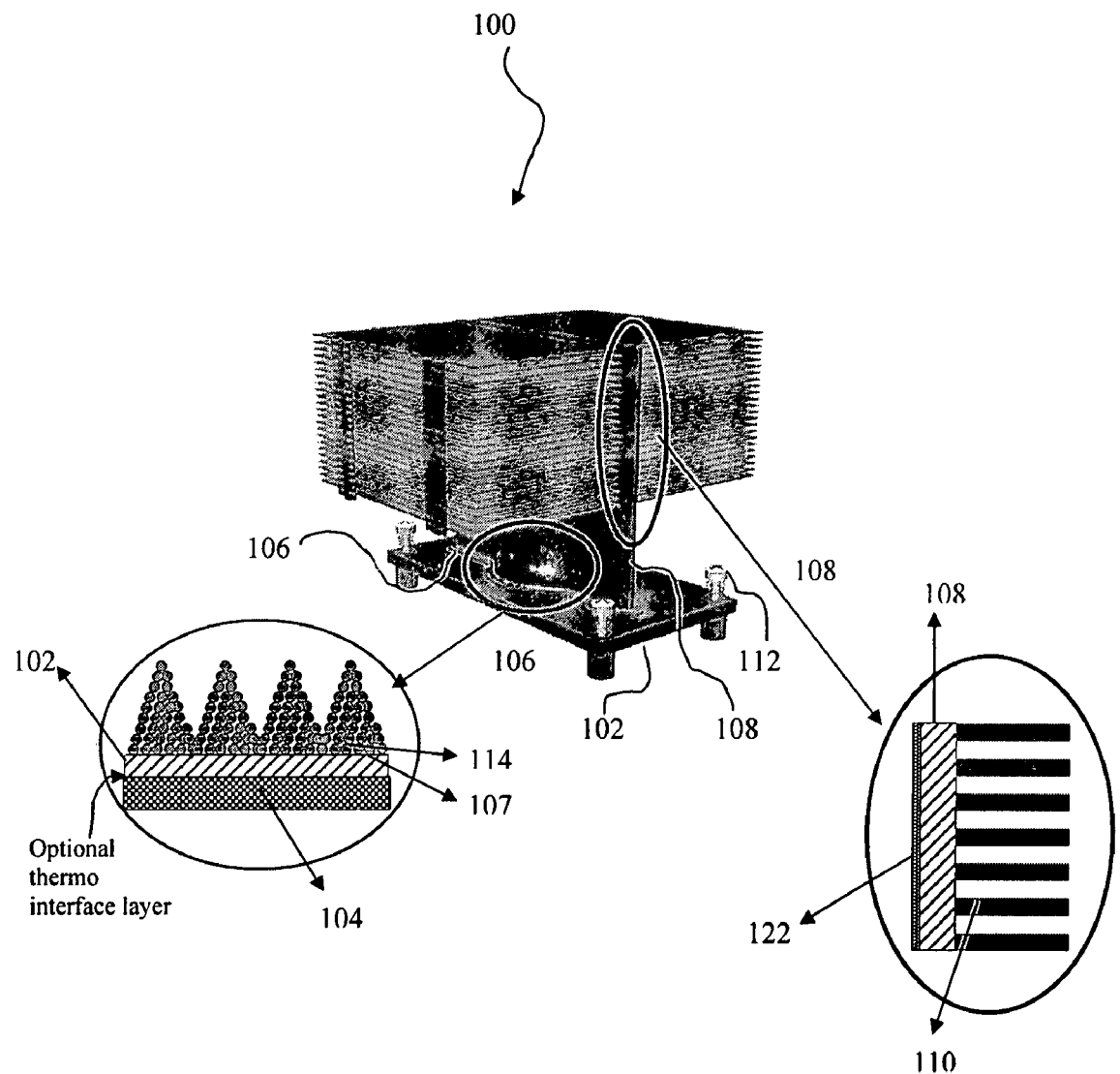
FIG. 1 illustrates an exemplary heat dissipating device in accordance with the present invention.

Embodiments of the present invention provide a heating dissipating apparatus that includes a low thermal resistance thermosiphon device having an efficient boiling structure and condenser structure. FIG. 1 illustrates an exemplary embodiment of a heat dissipating apparatus 100 that employs a thermosiphon concept with an enhanced boiling structure and condensation surfaces. In a thermosiphon concept, a container is provided with liquid coolant in an evaporator section and heat input to this section results in vapor, which condenses in a condenser section where heat is rejected or dissipated. The thermosiphon performance is strongly dependent on the orientation given the fact that it operates based on the gravitational and buoyancy forces. Therefore, in order to enhance the thermosyphon performance it is appropriate to focus on thermal performance rather than the orientation-independence.

FIG. 1 illustrates that the heat dissipating apparatus 100 comprises a receptor plate 102, an evaporator 106, and condenser column 108. In one embodiment, a set of condenser extension surfaces 110 is also included with the heat dissipating apparatus 100. In one embodiment, the receptor plate 102 is placed in contact with an integrated circuit device 104 that generates heat or that needs heat dissipation. The receptor plate 102 is typically placed over the integrated circuit device 104. The receptor plate 102 may be placed over the integrated circuit device 104 in a way that completely covers, substantially covers, or seals the integrated circuit underneath the receptor plate 102. The integrated circuit device 104 can be a number of electronic devices such as a semiconductor device, a transistor, a capacitor, a resistor, a sensor, an optical element, a microprocessor, a hard drive element, an optical element, a memory structure, a power source, a display driver, and a display element, to name a few. In one embodiment, the receptor plate 102 includes a set of mechanical securing structures e.g., screws 112, to facilitate the securing of the receptor plate 102 over the integrated circuit device. The receptor plate 102 can be secured to the board or the housing that is coupled to the integrated circuit device to place the receptor plate 102 in contact or over the integrated device. In one embodiment, the receptor plate 102 is placed in an immediate contact with the integrated circuit device 104. In another embodiment, a thermal interface (not shown) is disposed between the receptor plate 102 and the integrated circuit device 104. The thermo interface is thermally conductive and can be a thermally conductive grease (e.g., silver grease). In one embodiment, the receptor plate 102 is about the same size or larger than the integrated circuit device. The receptor plate 102 can be made of a rigid material with good thermally conducting properties (e.g., copper or aluminum).

Figure 2:
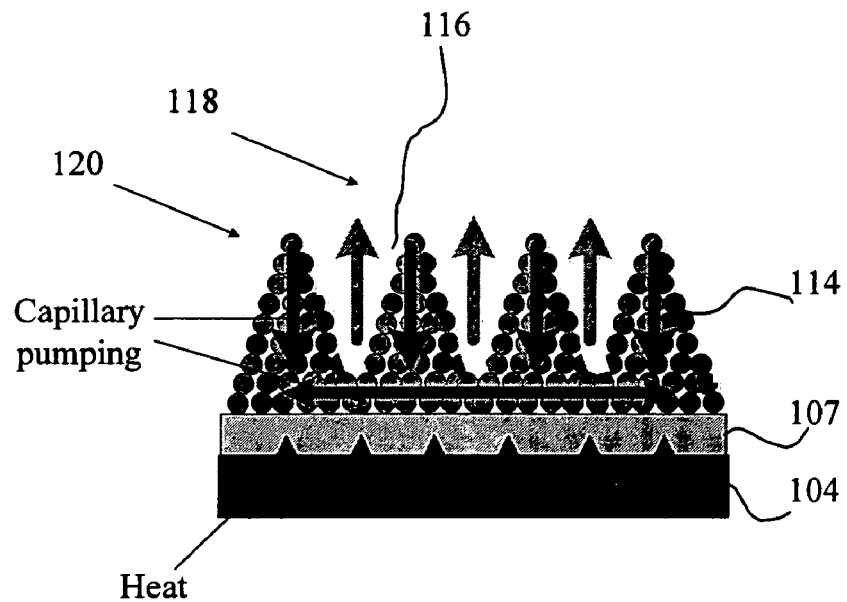
FIG. 2 illustrates an exemplary modulated porous layer coated on the inner wall of an evaporator of the heat dissipating device shown in FIG. 1.

The evaporator 106 is coupled to or placed on top of the receptor plate 102. The evaporator 106 is hollow and made out of a conductive material such as copper or aluminum. In one embodiment, the evaporator 106 inner wall 107 is coated with a modulated porous layer. The evaporator 106 stores a coolant liquid (e.g., water) and as the heat is input, the evaporate 106 boils the liquid due to the heat transferred from the integrated circuit device and forms vapors, which will travel up to the condenser column 108. The modulated porous layer (which is commercially available) creates or enhances the vapor escape path in the evaporator 106 as shown in FIG. 2. The vapors thus can escape toward the condenser column 108 more quickly and efficiently.

Modulated porous layer 114 is a coating with periodic or designed variations in layer thickness as shown in FIG. 2. Modulation is imposed to create alternating regions 116 of low resistance to vapor escape and high capillary-assisted liquid draw. The modulated porous layer 114 results in preferential liquid vapor counter flow paths 118 within the layer 114 facilitating heat transfer from the surface of the inner wall 107 to the liquid pool 120. The modulated porous layer 114 is made from spherical conductive particles (e.g., copper particles) sieved within a narrow band of mesh sizes to provide near uniform particle diameters. In one embodiment, the modulated porous layer is formed by consolidating loose particles (e.g., adhering) to each other and to the inner wall 107 by a dry-phase diffusion sintering technique in a tube furnace with a reducing atmosphere having inert (e.g., Nitrogen) gases and hydrogen gas. Sintering times and temperature may vary with particle size. For example, for particle sizes of 150-250 m nominal diameters, sintering occurs at around 900-1200° C. for about several hours (e.g., 2-4 hours). In one embodiment, during sintering, the particles are held in the desired modulation shape using open-faced molds. The loose particles are poured into the mold and the excess particles are removed to leave behind the substantially uniform thickness modulated porous layer 114 on top of the inner wall 107 layer. After sintering, the inner wall 107 is lifted from the mold with the modulated porous layer 114 attached to the inner wall 107.

The modulated porous layer 114 can have various patterns or designs. Exemplary designs or patterns include staggered, in line, and random height arrays of conductive particles.

Reducing the evaporator resistance must be the priority target for improvements as it usually is the largest. Using a uniform porous layer in the evaporator is a commonly accepted enhancement technique for pool boiling and it is demonstrated in many studies that it can enhance the performance up to three times when compared with a plain surface. This is mostly due to creating more nucleation sites, increasing the heat transfer area and capillary pumping across the layer. However, it is possible to further enhance the performance of the evaporator using a modulated porous layer up to two times when compared with the uniform porous coating. The modulated porous layer both helps the capillary pumping of the liquid through the porous structures and the base layer, while the vapor can escape easily through the "valleys" between the porous structures preventing the choking (FIG. 2).

Figure 3:
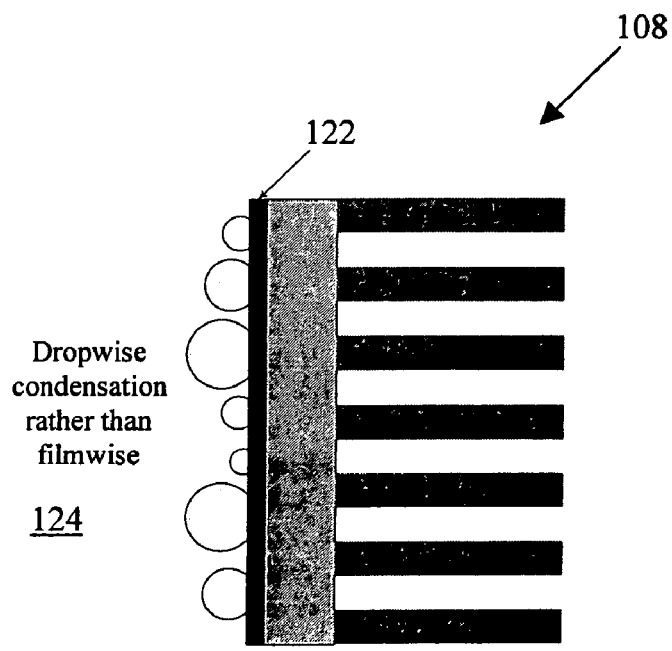
FIG. 3 illustrates an exemplary embodiment of a condenser column and dropwise condensation on the condense column.

The condenser column 108 (FIGS. 1 and 3) is placed in liquid communication with the evaporator 106 so that vapors from the evaporator 106 can pass into the condenser column 108 and the liquid droplets from the condenser column 108 can pass back down to the evaporator 106. Air can be used to blow across the condenser column 108 to dissipate heat and condense the vapors. In one embodiment, the receptor plate 102, the evaporator 106, and the condenser column 108 are made as one integral unit. In other embodiments, the receptor plate 102, the evaporator 106, and the condenser column 108 are each separate parts assembled together using methods known in the art. The condenser column 108 is hollow. FIG. 3 illustrates that the condenser column 108 has a substantially non-wetting surface 122. In one embodiment, the condenser column 108 inner wall is coated with a non-wetting or a hydrophobic material such that when vapor condenses upon the wall of the condenser column 108, droplets of vapors 124 are formed as opposed to films of vapors. An example of such a hydrophobic material includes polytetrafluorethylene (PTFE), also commercially available under the tradename of TEFLON® (a trademark of DuPont Chemicals). That way, the vapor droplets 124 can quickly be recycled down to the evaporator 106. Without the non-wetting surface 122, the vapor will accumulate on the wall of the condenser column 108 into a film wise condensation until the droplets or layers of liquid are large and heave enough to return back to the evaporator 106. Recycling the liquid allows for the elimination of the need to refill or re-supply the coolant liquid into the evaporator 106. Additionally, the heat transfer coefficient associated with the drop wise condensation is usually an order of magnitude larger than it is for film wise condensation. Moreover, it is much more efficient for the heat dissipating device 100 to recycle the vapor droplets as quickly as possible as the small droplets are formed on the non-wetting surface.

The set of condenser extension surfaces 110 can be plates, fins, or channels extending from the condenser column 108. The condenser extension surfaces 110 can be made of a thermally conductive material such as copper, aluminum, etc. The condenser extension surfaces 110 facilitate the heat dissipation. The condenser extension surfaces 110 provide more surface area to dissipate heat generated by the integrated circuit device. Without the set of condenser extension surfaces 110, heat is dissipated only through the condenser column 108. Further, the presence of the condenser extension surfaces 110 allows the heat transfer coefficient for the heat dissipating device 100 to be lower than without the condenser extension surfaces 110.

In one embodiment, the set of condenser extension surfaces 110 extends from the condenser wall of the condenser column 108. Air is blown through the set of condenser extension surfaces 110 to dissipate heat. Air is blown through to keep the condenser extension surfaces 110 and/or the condenser column 108 cool. When the coolant liquid stored in the evaporator 106 is boiled by the heat transfer from the integrated circuit via the receptor plate 102, the coolant liquid transforms into to vapors which meet the cooled condenser column 108 and begin to condense and recycle the condensed vapors down to the evaporator 106.

An important part of the heat dissipating device 100 is the condenser column 108. Using a surface coating that inhibits the wetting dropwise condensation can be achieved rather than the filmwise condensation provides the heat dissipating device 100 with an efficient way to quickly recycle the vapor droplets down to the evaporator 106 with a high heat transfer coefficient. The heat transfer coefficient of associated with the dropwise condensation is usually an order of magnitude larger than it is for filmwise condensation. (FIG. 3).

By adding the modulated porous layer in the evaporator and the non-wetting surface coating over the condenser inner wall, the total resistance in the heat dissipating device is reduced. As the ratio of the heat transfer increases, (due to the incorporation of the modulated porous layer and the non-wetting surface coating), the temperature difference in the heat dissipating device decreases, and the thermal resistance is reduced. The heat dissipating device is thus more efficient. Additionally, the modulated porous layer allows for more heat transfer with low temperature difference between the edges and the center of the evaporator condenser column and the condenser extension surfaces. Thus, the temperature in the evaporator wall and the fluid is more evenly distributed and the wall temperature in the condenser column is lower due to the non-wetting surface coating in the inner wall of the condenser column.

Figure 4:
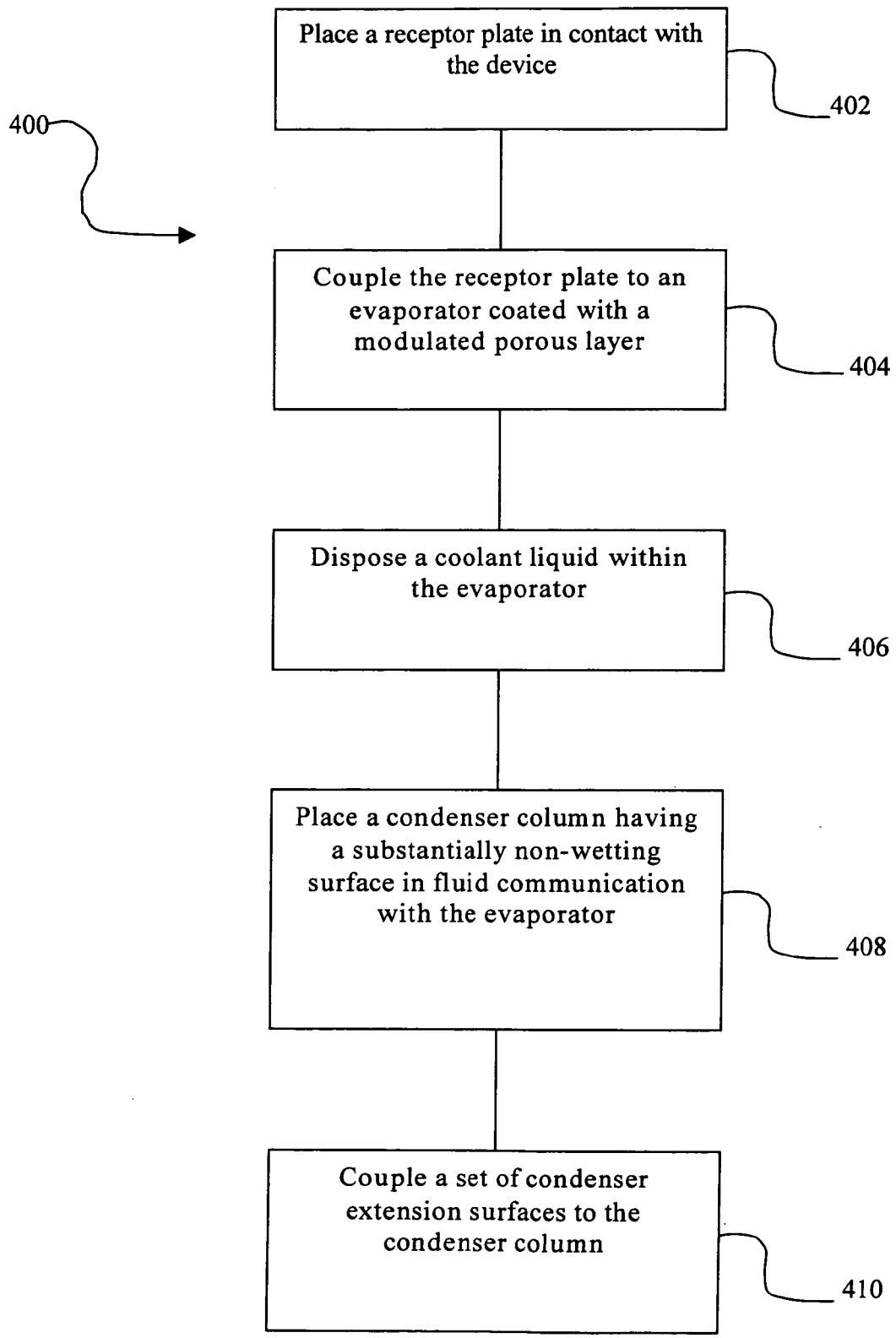
FIG. 4 illustrates an exemplary method of constructing a heat dissipating device in accordance with embodiments of the present invention.

FIG. 4 illustrates an exemplary method 400 of constructing a heat dissipating device in accordance to exemplary embodiments of the present invention. Such a heat dissipating device can be used to dissipate heat or cool off devices such as a semiconductor device, a transistor, a capacitor, a resistor, a sensor, an optical element, a microprocessor, a central processing unit, a circuit board/card, a memory structure, a power source, a display driver, and a display element. At box 402, a receptor plate is placed in contact or over the integrated circuit device. A mechanical attachment feature such as a set of screws may be included for securing the receptor over the integrated circuit device. At box 404, an evaporator coated with a modulated porous layer is coupled to the receptor plate. The receptor plate and the evaporator are placed in contact with the integrated circuit device such that heat generated from the integrated circuit device can be transferred to the receptor plate and the evaporators. In one embodiment, a thermally conductive layer is disposed between the receptor plate and the integrated circuit device to facilitate such heat transfer. The receptor plate and the evaporator may be assembled or made together as one unit and placed over the integrated circuit device. At box 406, a coolant liquid (e.g., water, in one embodiment) is disposed within the evaporator. The receptor plate and the evaporator with the coolant liquid may be assembled or made together as one unit and placed over the integrated circuit device. At box 408, a condenser column having a substantially non-wetting surface is placed in a fluid communication with the evaporator. At box 410, a set of condenser extension surfaces is coupled to the condenser column. Similar to discussed above, the receptor plate and the evaporator with the coolant liquid, and the condenser column with the condenser extension surfaces may be assembled or made together as one unit and placed over the integrated circuit device.

The heat transferred to the evaporator through the receptor plate causes the coolant liquid to boil and form vapors that will travel up to the condenser column. The modulated porous layer facilitates an efficient escape for the vapors to the travel up to the condenser column. The substantially non-wetting surface facilitates quick condensation of the vapors so that they can be recycled quickly down the evaporator. The condenser extension surfaces help dissipating the heat and keep the condenser column cooled.

Figure 5:
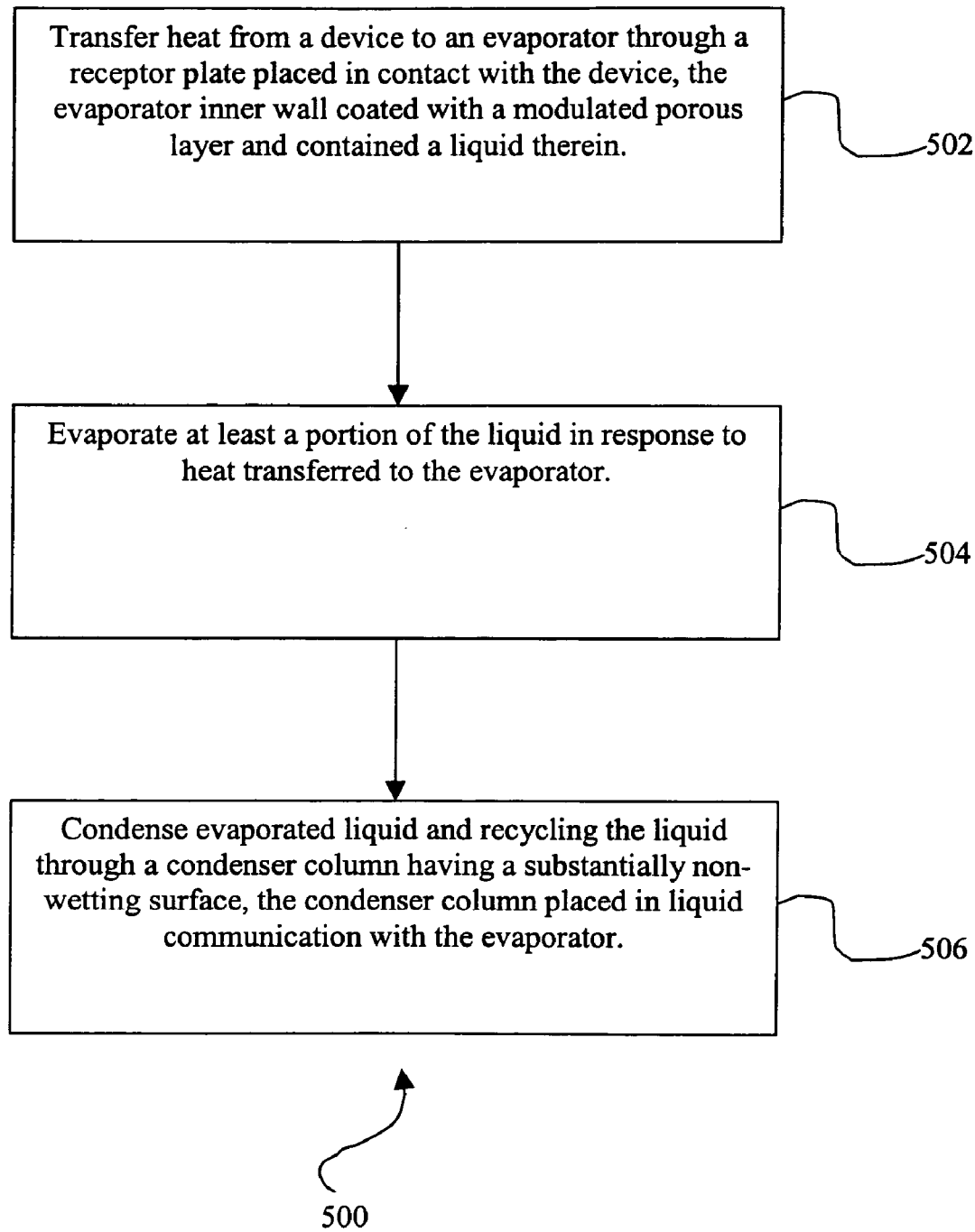
FIG. 5 illustrates an exemplary method of dissipating heat off a device such as an integrated circuit device.

FIG. 5 illustrates an exemplary embodiment 500 of dissipating heat from a device that generates heat such as an integrated circuit device, semiconductor device, a transistor, a capacitor, a resistor, a sensor, an optical element, a microprocessor, a central processing unit, a circuit board/card, a memory structure, a power source, a display driver, and a display element. At box 502, heat is transferred from the device to an evaporator through a receptor plate placed in contact with the device. The evaporator inner wall is coated with a modulated porous layer. The evaporator also contains a coolant liquid (e.g., water in one embodiment) therein. At box 504, at least a portion of the liquid contained in the evaporator is evaporated in response to heat transferred to the evaporator through the receptor plate. The liquid is evaporated through a capillary pumping action created by the modulated porous layer in the evaporator. At box 506, the evaporated liquid is condensed and recycled through a condenser column having a substantially non-wetting surface (e.g., created by a hydrophobic coating or a TEFLON® coating on the inner wall of the condenser column). The condenser column is placed in liquid communication with the evaporator so that the condensed liquid can be recycled down to the evaporator. In one embodiment, a set of condenser extension surfaces coupling to the condenser column is used to facilitate the evaporated liquid (vapors) to condense, for example, air is blown across the condenser extension surfaces to keep the condenser column to cause the vapor to condense. In one embodiment, the evaporated liquid is condensed in a dropwise manner almost or substantially immediately as the evaporated liquid contacts the substantially non-wetting surface. In one embodiment, a thermo interface layer is disposed between the heater block and the device so that heat can be transferred from the device to the evaporator.

The embodiments of the present invention can be incorporated into a computer system. In some embodiments, the heat dissipating device is placed over one or more components of the computer system to dissipate heat from such components. The computer system may include a memory device or structure to store, at least, temporarily, data and program; a mass storage device (e.g., a hard drive, a disk drive, a CD drive, or a DVD drive) to retain large amounts of data; an input device (e.g., a keyboard or a mouse) for entering data and instructions into the computer; an output device (e.g., a display screen); and a microprocessor including a central processing unit (CPU) that executes the instructions for the computer system. The computer system may also include a main logic board. The computer system may further include a graphic controller chip for controlling the display apparatus of the computer system and which may communicate with the main logic board. In some embodiments, one or more heat dissipating devices in accordance to embodiments of the present invention is placed over the graphic controller chip, the microprocessor, the CPU, and/or the memory device. The heat dissipating device is placed over the particular device similarly to previously described above for an integrated circuit device.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. A computer system comprising:
   a main logic board;
   an integrated circuit device interconnected to the main logic board;
   a receptor plate placed over the integrated circuit chip device and coupled to the main logic board;
   an evaporator coupling to the receptor plate, the evaporator coated with a modulated porous layer and storing a liquid; and
   a condenser column placed in liquid communication with the evaporator, the condenser column having a non-wetting surface.

2. The computer system of claim 1 further comprising:
   a set of condenser extension surfaces extending from the condenser column, the condenser extension surfaces to facilitate heat dissipation.

3. The computer system of claim 2 wherein the condenser extension surfaces include any one of fins, channels, and plates.

4. The computer system of claim 1 wherein the integrated circuit device is any one of a semiconductor device, a transistor, a capacitor, a resistor, a sensor, an optical element, a microprocessor, a memory structure, a power source, a graphic controller chip, a display driver, and a display element.

5. The computer system of claim 1 wherein the receptor is placed over the integrated circuit device so as to seal the integrated circuit device.

6. The computer system of claim 1 further comprises a thermo interface layer disposed between the receptor plate and the integrated circuit device.

7. The computer system of claim 1 wherein the condenser column is coated with a hydrophobic material to create the non-wetting surface.

8. The computer system of claim 1 wherein the condenser column recycles the liquid down to the evaporator.

* * * * *